United States Patent
Alptekin et al.

(10) Patent No.: US 9,331,166 B2
(45) Date of Patent: May 3, 2016

(54) SELECTIVE DIELECTRIC SPACER DEPOSITION FOR EXPOSING SIDEWALLS OF A FINFET

(71) Applicant: International Business Machines Corporation, Armonk, NY (US)

(72) Inventors: Emre Alptekin, Wappingers Falls, NY (US); Sameer H. Jain, Beacon, NY (US); Viraj Y. Sardesai, Poughkeepsie, NY (US); Cung D. Tran, Newburgh, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/519,549

(22) Filed: Oct. 21, 2014

(65) Prior Publication Data
US 2015/0270365 A1 Sep. 24, 2015

Related U.S. Application Data

(63) Continuation of application No. 14/220,299, filed on Mar. 20, 2014, now Pat. No. 9,111,962.

(51) Int. Cl.
*H01L 29/78* (2006.01)
*H01L 27/088* (2006.01)
(Continued)

(52) U.S. Cl.
CPC ...... *H01L 29/4983* (2013.01); *H01L 21/02266* (2013.01); *H01L 21/02639* (2013.01); *H01L 21/263* (2013.01); *H01L 21/314* (2013.01); *H01L 21/316* (2013.01); *H01L 21/318* (2013.01); *H01L 29/41783* (2013.01); *H01L 29/66795* (2013.01); *H01L 29/785* (2013.01); *H01L 29/7851* (2013.01); *H01L 29/66803* (2013.01)

(58) Field of Classification Search
CPC ...................................................... H01L 29/785
See application file for complete search history.

(56) References Cited

U.S. PATENT DOCUMENTS

| | | | |
|---|---|---|---|
| 7,646,070 B2 * | 1/2010 | Anderson | ......... H01L 29/66795 |
| | | | 257/401 |
| 8,354,320 B1 | 1/2013 | Xie et al. | |

(Continued)

OTHER PUBLICATIONS

Notice of Allowance dated Mar. 31, 2015 received in U.S. Appl. No. 14/220,299.

(Continued)

*Primary Examiner* — Victor A Mandala
*Assistant Examiner* — Regan J Rundio
(74) *Attorney, Agent, or Firm* — Scully, Scott, Murphy & Presser, P.C.; Steven J. Meyers, Esq.

(57) ABSTRACT

Angled directional ion beams are directed to sidewalls of a gate structure that straddles at least one semiconductor fin. The directions of the angled directional ion beams are contained within a vertical plane that is parallel to the sidewalls of the at least one semiconductor. A pair of gate spacers are formed on sidewalls of the gate structure by accumulation of the deposited dielectric material from the angled directional ion beams and without use of an anisotropic etch, while the sidewalls of the semiconductor fins parallel to the directional ion beams remain physically exposed. A selective epitaxy process can be performed to form raised active regions by growing a semiconductor material from the sidewalls of the semiconductor fins.

19 Claims, 19 Drawing Sheets

(51) Int. Cl.
*H01L 29/49* (2006.01)
*H01L 29/66* (2006.01)
*H01L 21/02* (2006.01)
*H01L 21/316* (2006.01)
*H01L 21/318* (2006.01)
*H01L 21/263* (2006.01)
*H01L 21/314* (2006.01)
*H01L 29/417* (2006.01)
*H01L 21/336* (2006.01)

(56) References Cited

U.S. PATENT DOCUMENTS

| | | | |
|---|---|---|---|
| 8,809,134 B2 * | 8/2014 | Yin | H01L 29/66795 257/330 |
| 2001/0010835 A1 | 8/2001 | Akizuki et al. | |
| 2002/0014407 A1 | 2/2002 | Allen et al. | |
| 2010/0038679 A1 | 2/2010 | Chan et al. | |
| 2011/0042744 A1 * | 2/2011 | Cheng | H01L 29/785 257/347 |
| 2011/0084214 A1 | 4/2011 | Hautala et al. | |
| 2011/0084215 A1 | 4/2011 | Hautala et al. | |
| 2011/0084216 A1 | 4/2011 | Hautala et al. | |
| 2011/0291188 A1 * | 12/2011 | Cheng | H01L 29/785 257/347 |
| 2013/0181264 A1 * | 7/2013 | Liao | H01L 29/785 257/288 |
| 2013/0292805 A1 | 11/2013 | Cai et al. | |
| 2014/0124840 A1 | 5/2014 | Khakifirooz et al. | |
| 2014/0203371 A1 | 7/2014 | Alptekin et al. | |
| 2014/0327090 A1 | 11/2014 | Cai et al. | |
| 2015/0200291 A1 * | 7/2015 | Alptekin | H01L 29/785 257/401 |

OTHER PUBLICATIONS

Office Action dated Feb. 5, 2015 received in U.S. Appl. No. 14/220,299.

* cited by examiner

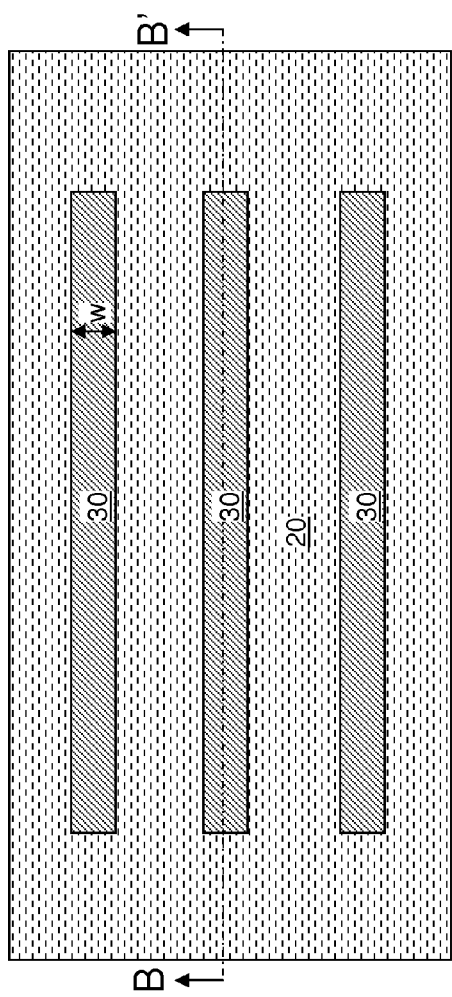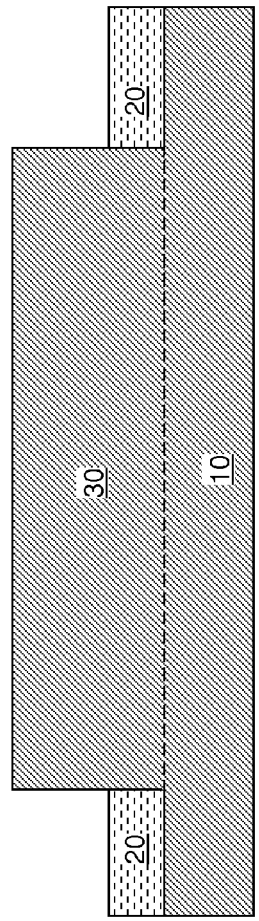

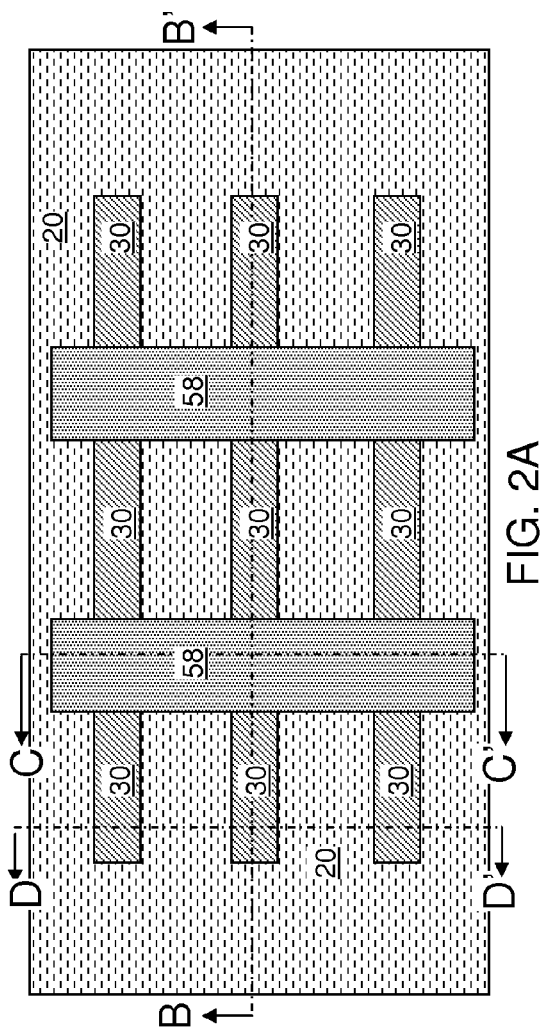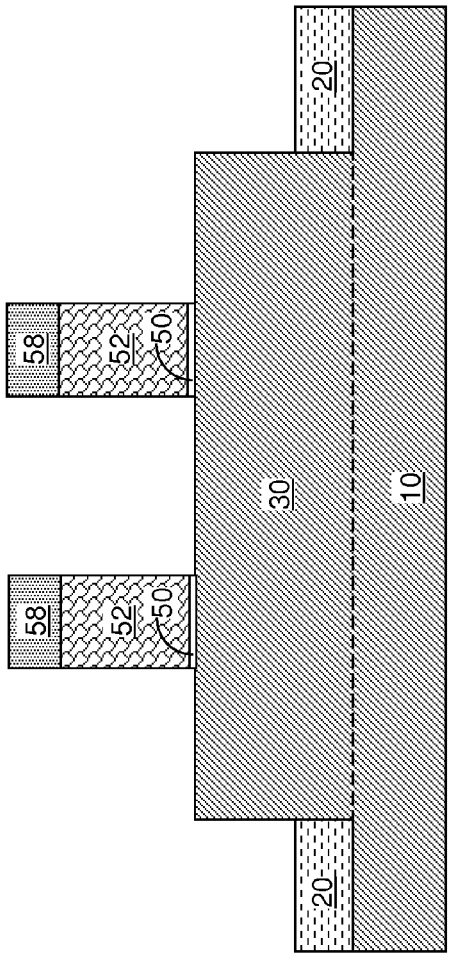
FIG. 2A
FIG. 2B

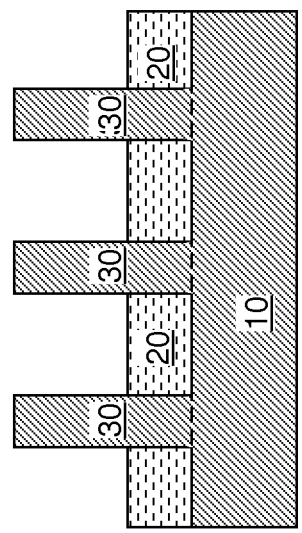
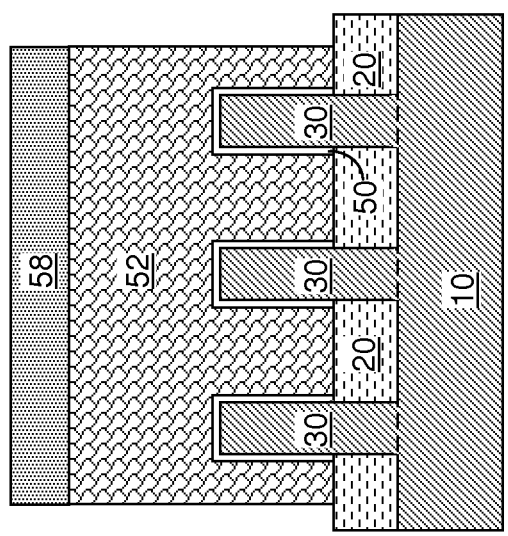
FIG. 2C
FIG. 2D

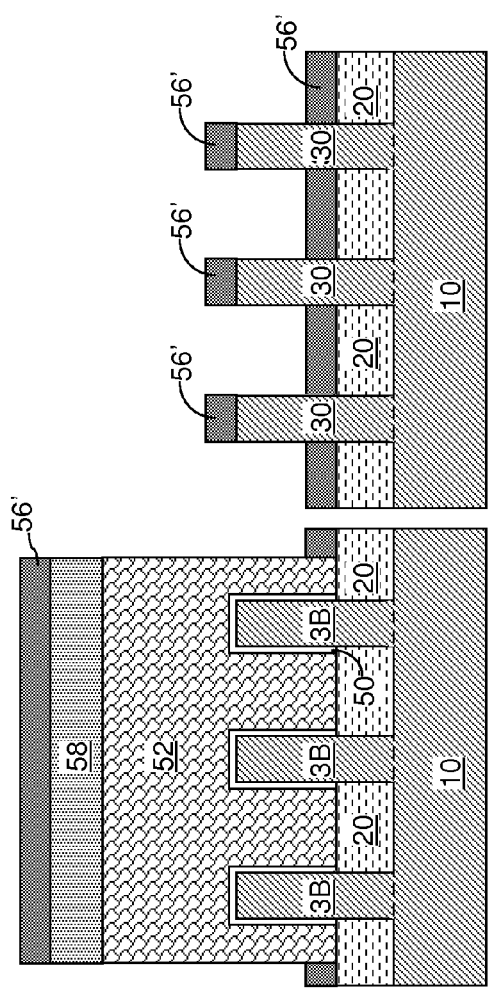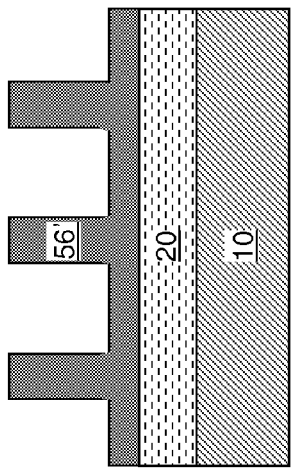

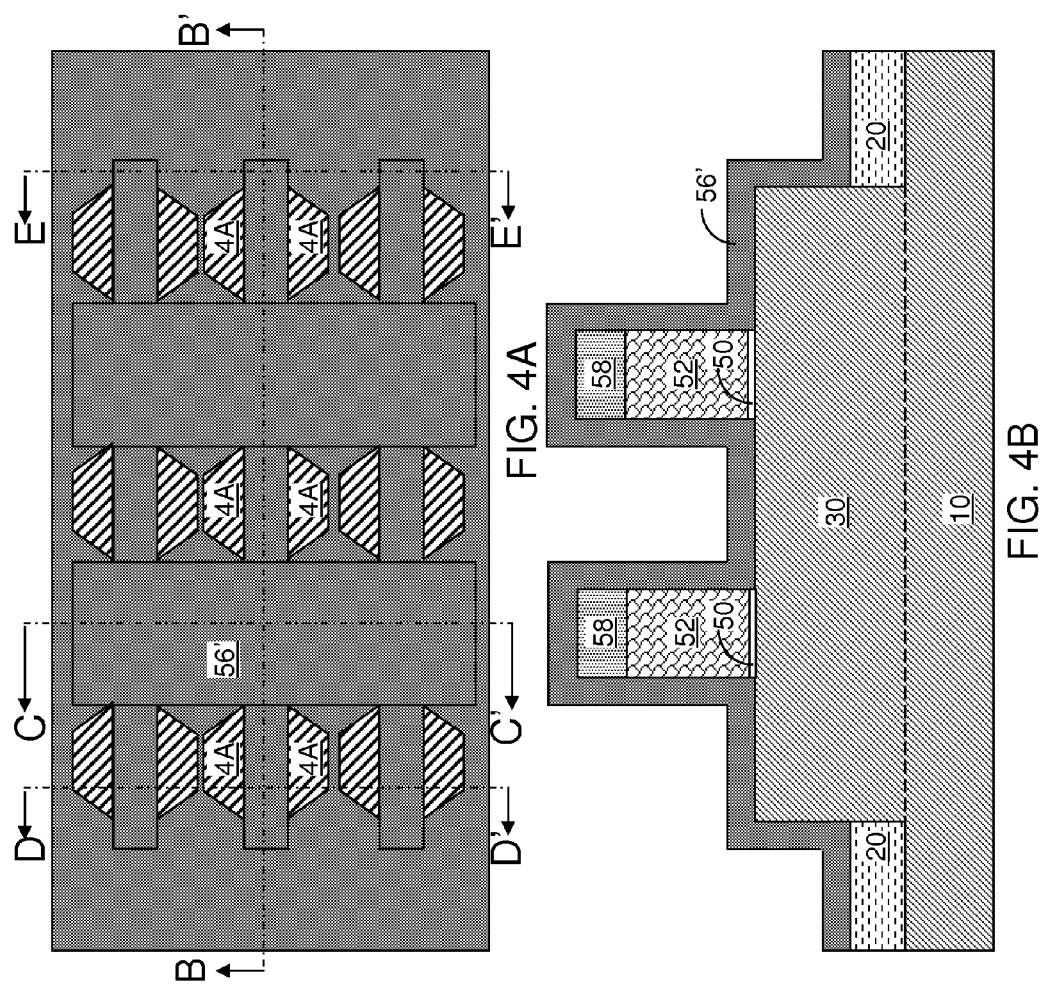

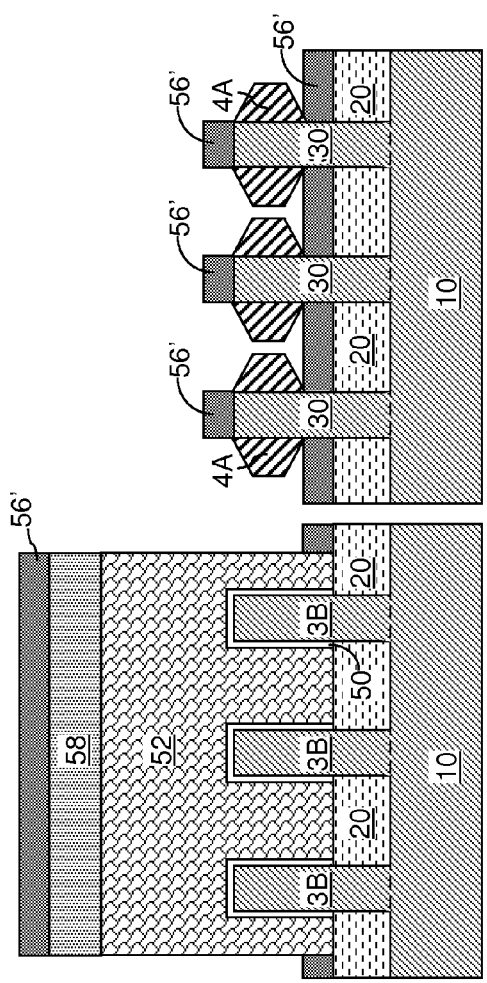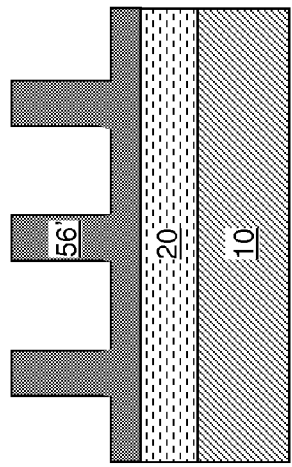

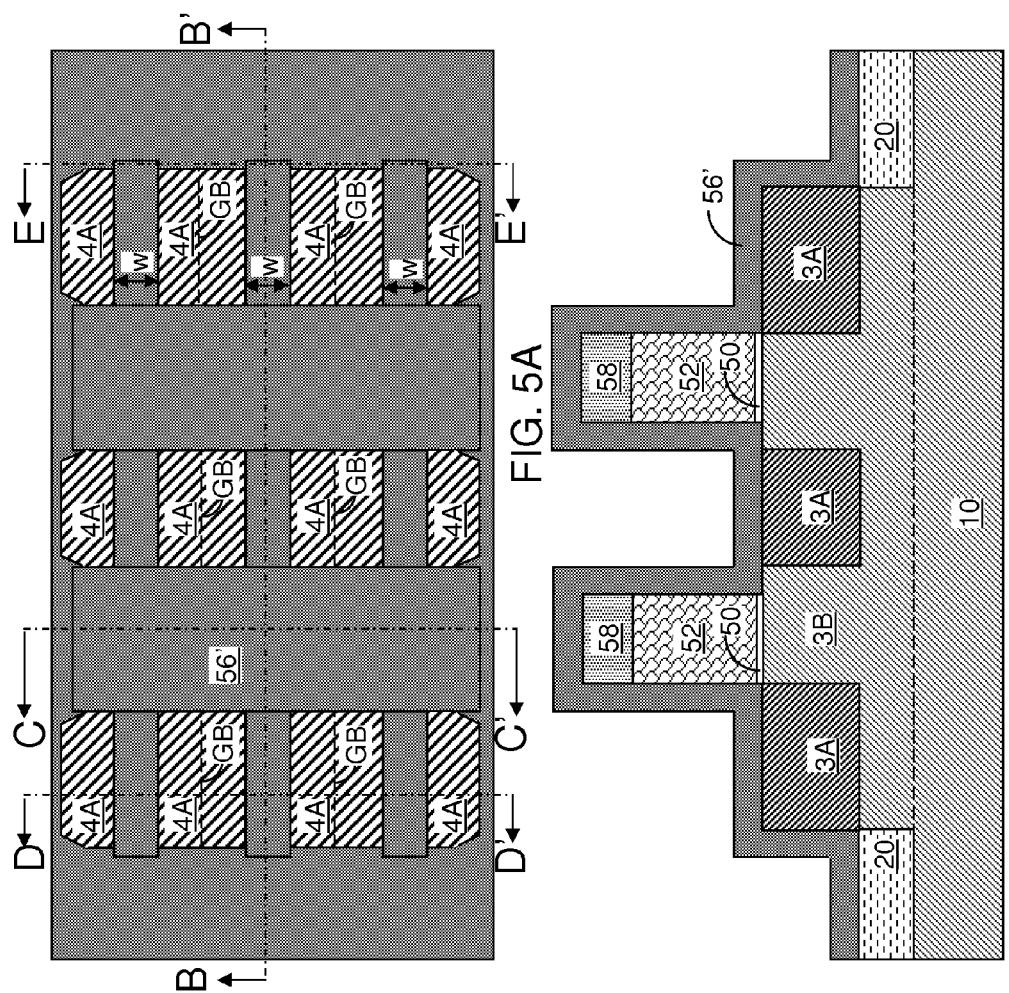

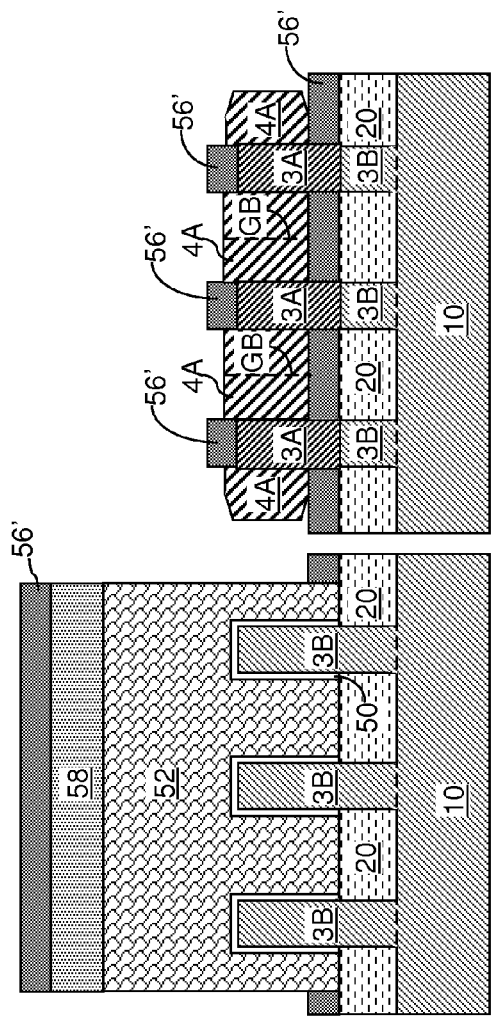
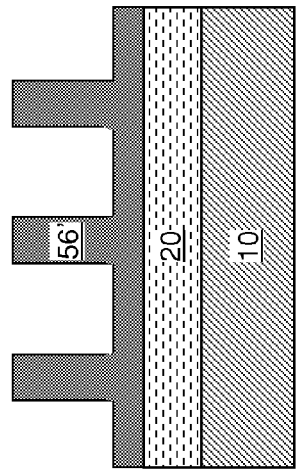
FIG. 5C
FIG. 5D
FIG. 5E

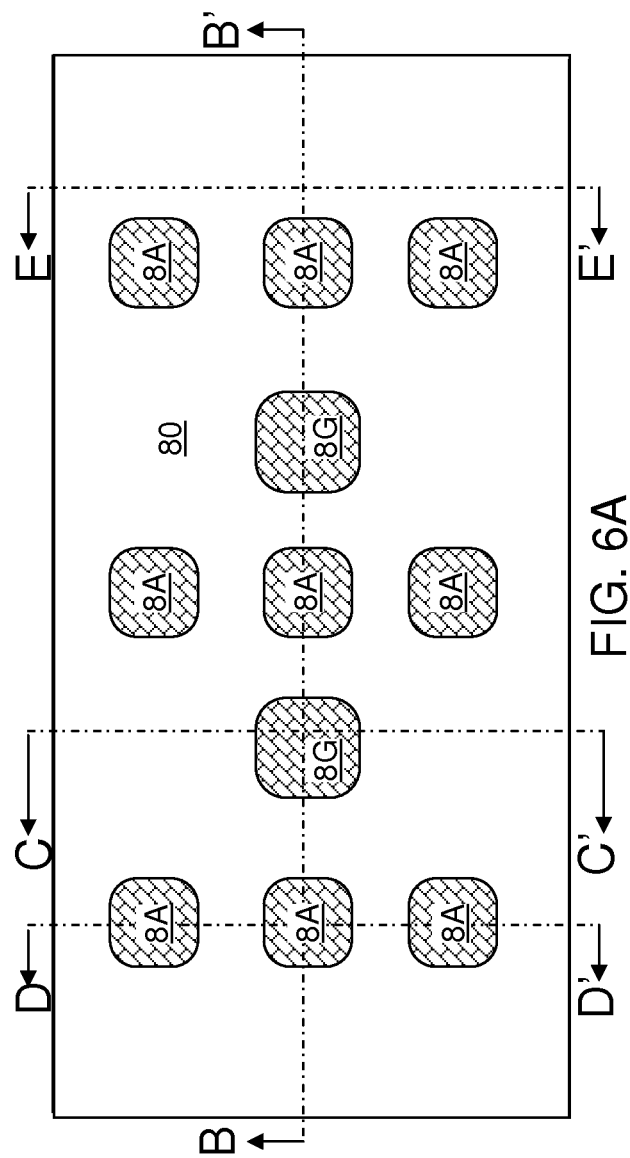

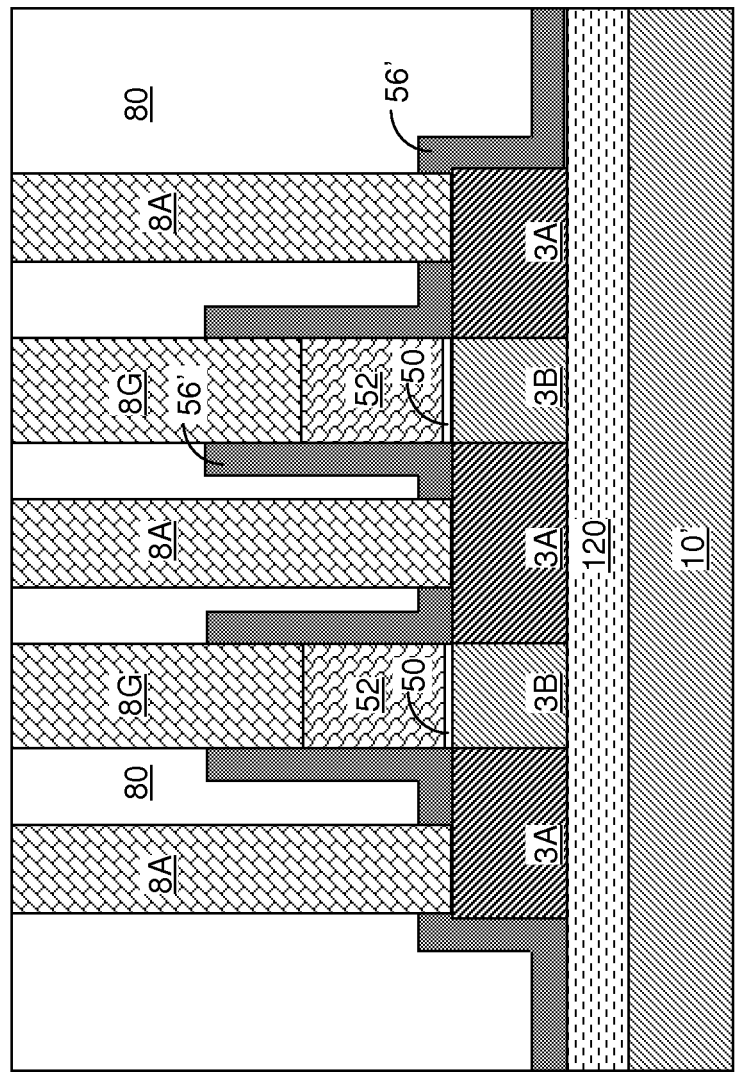

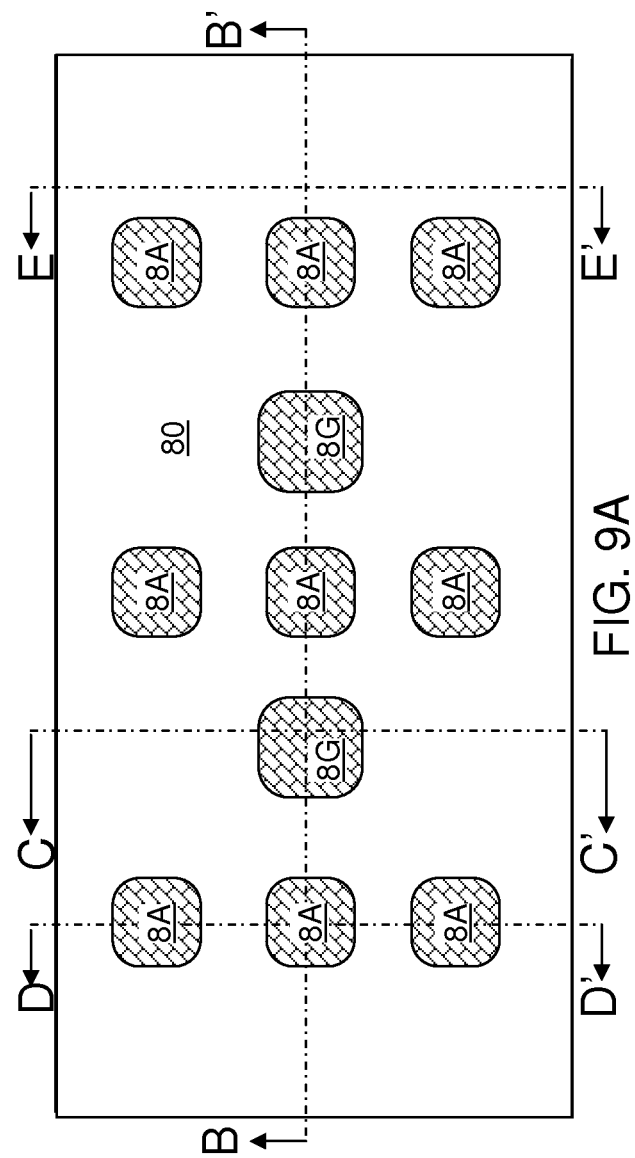

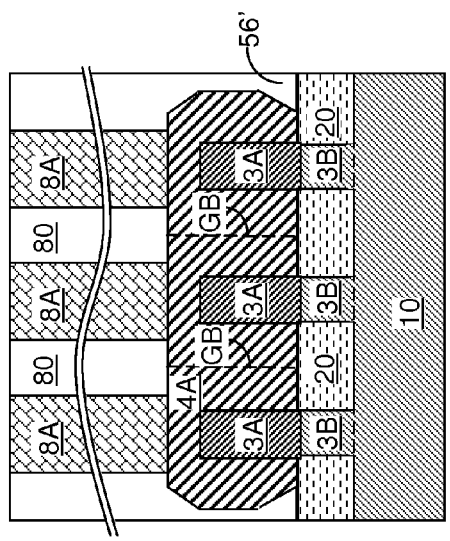
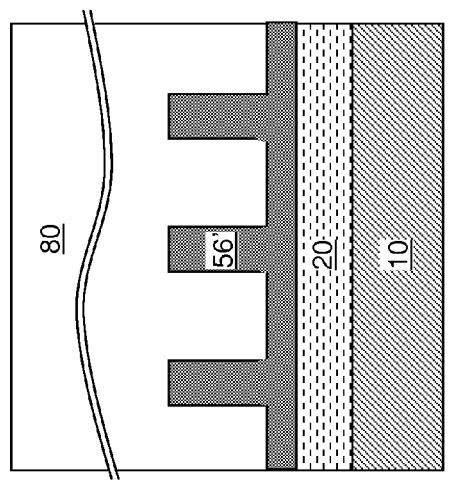
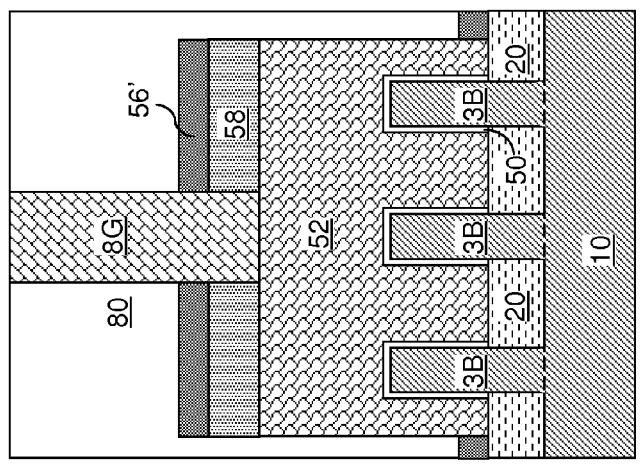
FIG. 9D
FIG. 9E
FIG. 9C

SELECTIVE DIELECTRIC SPACER DEPOSITION FOR EXPOSING SIDEWALLS OF A FINFET

BACKGROUND

The present disclosure relates to a semiconductor structure, and particularly to a method of forming a sidewall spacer for a fin field effect transistor (finFET) selectively on sidewalls of a gate electrode, and structures formed by the same.

A conventional gate spacer formation process includes conformal deposition of a dielectric material layer and a subsequent anisotropic etch that removes horizontal portions of the deposited dielectric material layer. In the case of a fin field effect transistor, therefore, vertical portions of the deposited dielectric material layer are present on the sidewalls of semiconductor fins. In order to remove the vertical portions of the deposited dielectric material layer from the sidewalls of the semiconductor fins, an extended anisotropic etch process must be employed. Collateral etching of other dielectric materials, such as a shallow trench isolation structure, must be minimized during the extended anisotropic etch process for removing the vertical portions of the deposited dielectric material layer from the sidewalls of the semiconductor fins. The need to remove the deposited dielectric material from the sidewalls of the semiconductor fins imposes severe limitations on selection of dielectric materials that can be employed for the conventional gate spacer.

SUMMARY

Angled directional ion beams are directed to sidewalls of a gate structure that straddles at least one semiconductor fin. The directions of the angled directional ion beams are contained within a vertical plane that is parallel to the sidewalls of the at least one semiconductor. A pair of gate spacers are formed on sidewalls of the gate structure by accumulation of the deposited dielectric material from the angled directional ion beams and without use of an anisotropic etch, while the sidewalls of the semiconductor fins parallel to the directional ion beams remain physically exposed. A selective epitaxy process can be performed to form raised active regions by growing a semiconductor material from the sidewalls of the semiconductor fins.

According to an aspect of the present disclosure, a method of forming a semiconductor structure is provided. A semiconductor fin extending along a lengthwise direction is formed on a substrate. A gate structure is formed over, and across, the semiconductor fin. A dielectric material liner is formed on surfaces of the semiconductor fin and the gate structure employing a pair of directional ion beam deposition processes. A directional ion beam contained within a vertical plane defined by the lengthwise direction and a vertical direction impinges on the surfaces of the semiconductor fin and the gate structure during each of the pair of directional ion beam deposition processes.

According to another aspect of the present disclosure, a semiconductor structure includes a semiconductor fin that is located on a substrate and extending along a lengthwise direction, a gate structure straddling the semiconductor fin and including a stack of a gate dielectric and a gate electrode, and a dielectric material liner located on the semiconductor fin. Portions of the dielectric material liner in contact with a top surface of the semiconductor fin and an end wall of the semiconductor fin have a same width as the semiconductor fin.

BRIEF DESCRIPTION OF SEVERAL VIEWS OF THE DRAWINGS

FIG. 1A is a top-down view of an exemplary semiconductor structure after formation of semiconductor fins and a shallow trench isolation layer according to an embodiment of the present disclosure.

FIG. 1B is a vertical cross-sectional view of the exemplary structure along the vertical plane B-B' in FIG. 1A.

FIG. 2A is a top-down view of the exemplary semiconductor structure after formation of gate structures according to an embodiment of the present disclosure.

FIG. 2B is a vertical cross-sectional view of the exemplary structure along the vertical plane B-B' in FIG. 2A.

FIG. 2C is a vertical cross-sectional view of the exemplary structure along the vertical plane C-C' in FIG. 2A.

FIG. 2D is a vertical cross-sectional view of the exemplary structure along the vertical plane D-D' in FIG. 2A.

FIG. 3C is a vertical cross-sectional view of the exemplary structure along the vertical plane C-C' in FIG. 3A.

FIG. 3D is a vertical cross-sectional view of the exemplary structure along the vertical plane D-D' in FIG. 3A.

FIG. 3E is a vertical cross-sectional view of the exemplary structure along the vertical plane E-E' in FIG. 3A.

FIG. 4A is a top-down view of the exemplary semiconductor structure during a selective epitaxy process according to an embodiment of the present disclosure.

FIG. 4B is a vertical cross-sectional view of the exemplary structure along the vertical plane B-B' in FIG. 4A.

FIG. 4C is a vertical cross-sectional view of the exemplary structure along the vertical plane C-C' in FIG. 4A.

FIG. 4D is a vertical cross-sectional view of the exemplary structure along the vertical plane D-D' in FIG. 4A.

FIG. 4E is a vertical cross-sectional view of the exemplary structure along the vertical plane E-E' in FIG. 4A.

FIG. 5A is a top-down view of the exemplary semiconductor structure after formation of raised active regions by the selective epitaxy process according to an embodiment of the present disclosure.

FIG. 5B is a vertical cross-sectional view of the exemplary structure along the vertical plane B-B' in FIG. 5A.

FIG. 5C is a vertical cross-sectional view of the exemplary structure along the vertical plane C-C' in FIG. 5A.

FIG. 5D is a vertical cross-sectional view of the exemplary structure along the vertical plane D-D' in FIG. 5A.

FIG. 5E is a vertical cross-sectional view of the exemplary structure along the vertical plane E-E' in FIG. 5A.

FIG. 6A is a top-down view of the exemplary semiconductor structure after formation of a contact level dielectric layer and various contact via structures according to an embodiment of the present disclosure.

FIG. 7 is a vertical cross-sectional view of a first variation of the exemplary structure.

FIG. 9A is a top-down view of a third variation of the exemplary semiconductor structure after formation of a contact level dielectric layer and various contact via structures according to an embodiment of the present disclosure.

FIG. 9C is a vertical cross-sectional view of the third variation of the exemplary structure along the vertical plane C-C' in FIG. 9A.

FIG. 9D is a vertical cross-sectional view of the third variation of the exemplary structure along the vertical plane D-D' in FIG. 9A.

FIG. 9E is a vertical cross-sectional view of the third variation of the exemplary structure along the vertical plane E-E' in FIG. 9A.

DETAILED DESCRIPTION

Figures 3A, 3B:
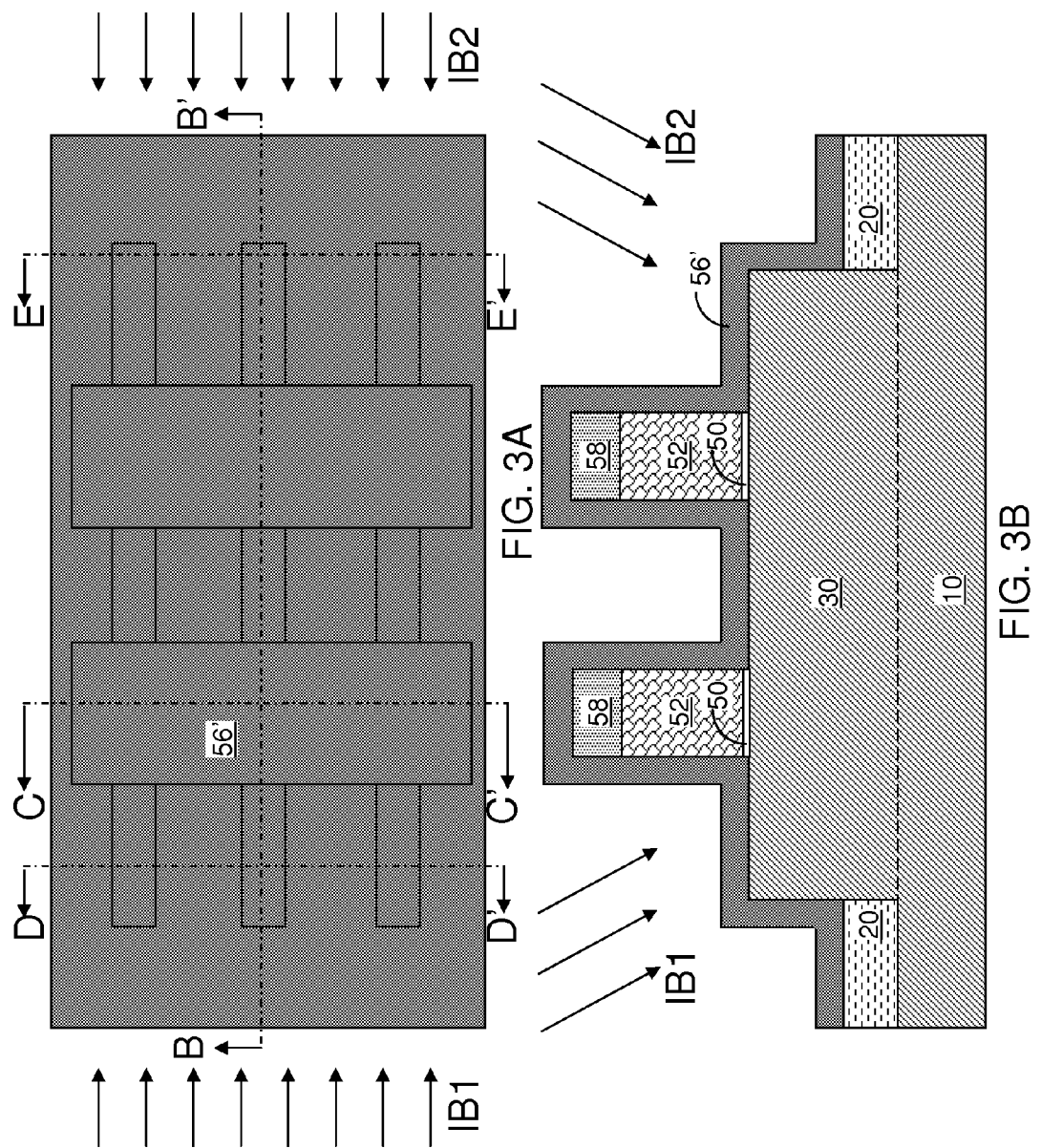
FIG. 3A is a top-down view of the exemplary semiconductor structure after formation of a dielectric material layer employing a directional ion beam according to an embodiment of the present disclosure.
FIG. 3B is a vertical cross-sectional view of the exemplary structure along the vertical plane B-B' in FIG. 3A.
Figure 3F:
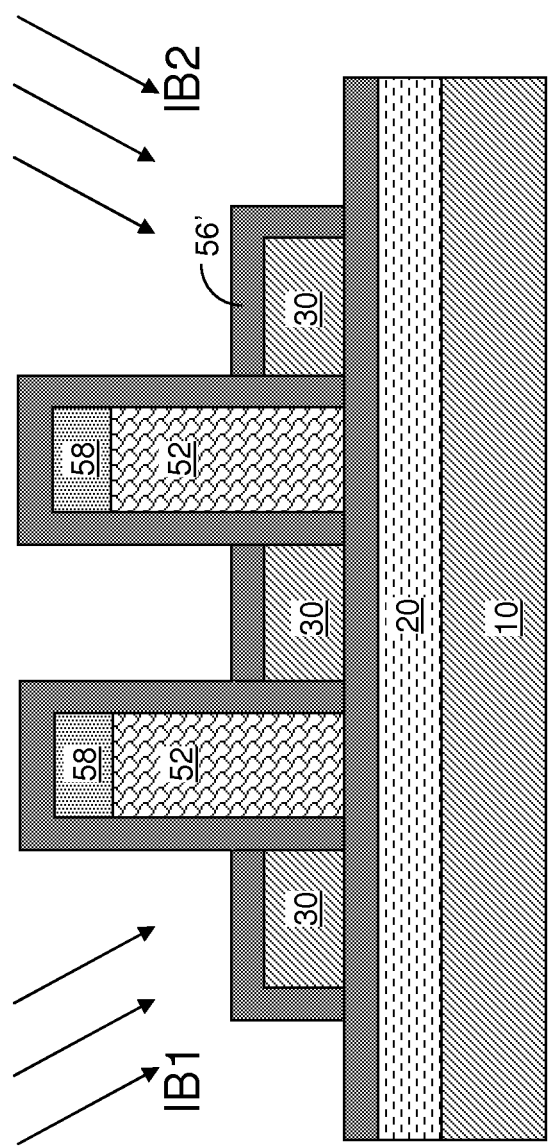
FIG. 3F is a side view of the exemplary structure of FIG. 3A.
Figure 6B:
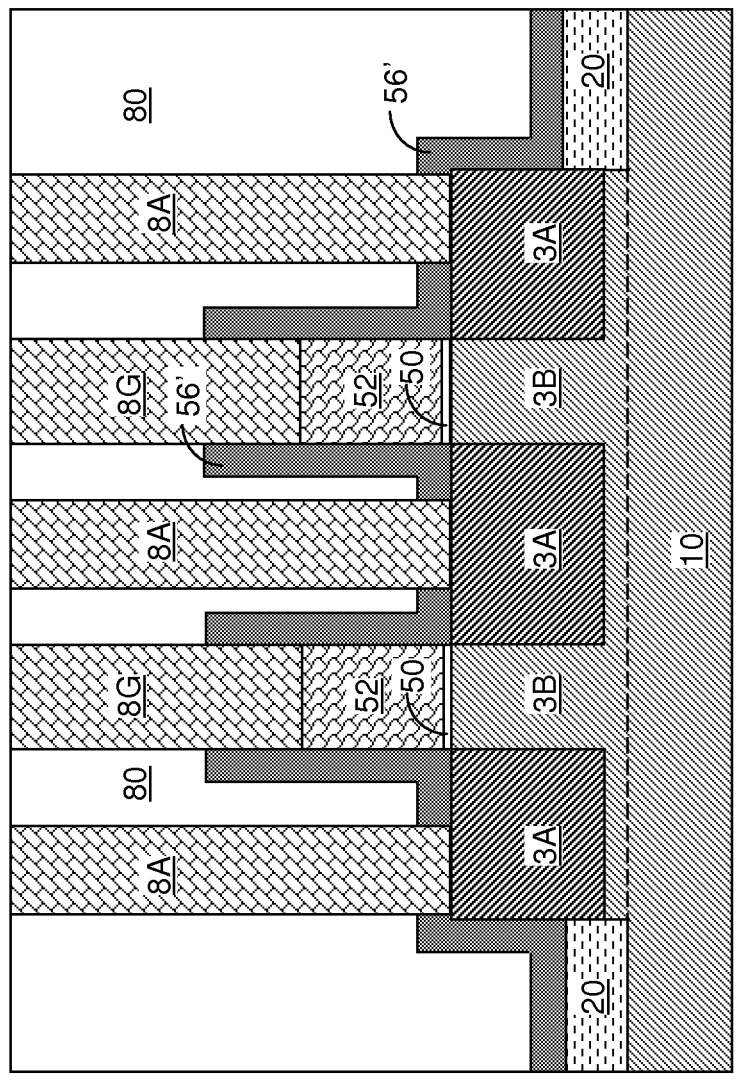
FIG. 6B is a vertical cross-sectional view of the exemplary structure along the vertical plane B-B' in FIG. 6A.
Figure 6C:
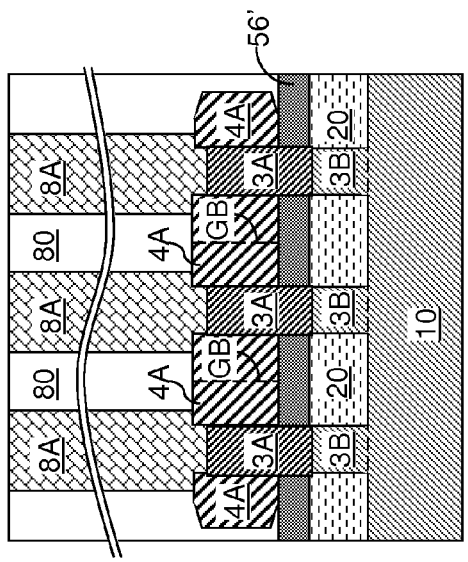
FIG. 6C is a vertical cross-sectional view of the exemplary structure along the vertical plane C-C' in FIG. 6A.
Figure 6E:
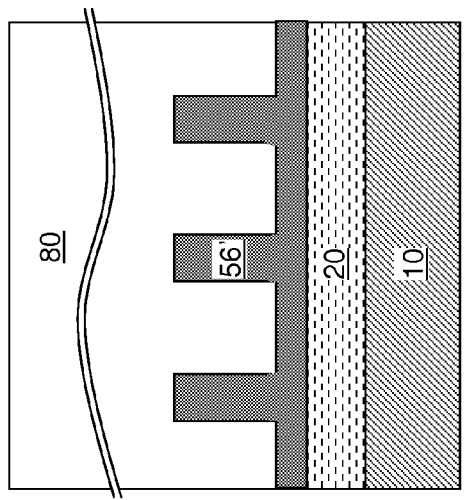
FIG. 6E is a vertical cross-sectional view of the exemplary structure along the vertical plane E-E' in FIG. 6A.
Figure 6D:
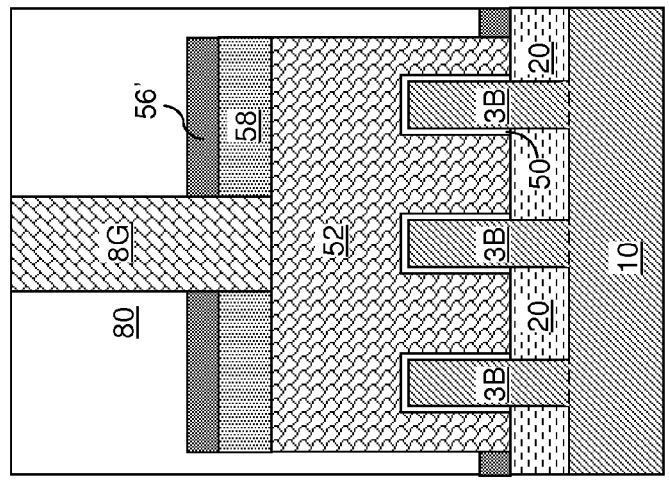
FIG. 6D is a vertical cross-sectional view of the exemplary structure along the vertical plane D-D' in FIG. 6A.

As stated above, the present disclosure relates to a method of forming a sidewall spacer for a fin field effect transistor (finFET) selectively on sidewalls of a gate electrode, and structures formed by the same. These aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A and 1B, an exemplary semiconductor structure according to an embodiment of the present disclosure can be formed by providing a semiconductor substrate, which can be a bulk semiconductor substrate or a semiconductor-on-insulator (SOI) substrate. At least an upper portion of the semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

The upper portion of the semiconductor substrate can be patterned, by a combination of lithographic methods and an anisotropic etch, to form a plurality of semiconductor fins 30. For example, a photoresist layer (not shown) can be applied over the top surface of the semiconductor substrate and lithographically patterned to mask portions of the semiconductor substrate in which the plurality of semiconductor fins 30 is subsequently formed. The pattern in the photoresist layer can be transferred into the upper portion of the semiconductor substrate to form the plurality of semiconductor fins 30. If the semiconductor substrate is a bulk substrate, the remaining portion of the semiconductor substrate underlying the plurality of semiconductor fins 30 is herein referred to as a semiconductor material layer 10. In this case, the semiconductor material layer 10 is a substrate on which the semiconductor fins 30 are formed. The semiconductor material layer 10 functions as a substrate mechanically supporting the plurality of semiconductor fins 30. The plurality of semiconductor fins 30 and the semiconductor material layer 10 collectively constitute a contiguous semiconductor material portion. In one embodiment, the entirety of the contiguous semiconductor material portion can be single crystalline. Alternatively, if the semiconductor substrate is a semiconductor-on-insulator substrate, a vertical stack of a buried insulator layer and a handle substrate layer can be present underneath the plurality of semiconductor fins 30 in lieu of the semiconductor material layer 10. In this case, the vertical stack of the buried insulator layer and the handle substrate layer is a substrate on which the semiconductor fins 30 are formed.

The height of the semiconductor fins 30 can be from 5 nm to 1,000 nm, although lesser and greater heights can also be employed. The plurality of semiconductor fins 30 and the semiconductor material layer 10 can be doped with electrical dopants, i.e., p-type dopants or n-type dopants, or can be intrinsic. In one embodiment, the entirety of the plurality of semiconductor fins 30 and the semiconductor material layer 10 can have a same type of doping, which is herein referred to as a first conductivity type. Optionally, a doped well (not shown) can be present in an upper portion of the semiconductor material layer 10 and underneath at least one semiconductor fin 30. Optionally, a channel stop layer having a doping of the opposite conductivity type as an upper portion of at least one semiconductor fin 30 may be provided at a bottom of the at least one semiconductor fin 30 or a portion of the semiconductor material layer 10 that underlies the at least one semiconductor fin 30. In general, various portions of the semiconductor material layer 10 and the semiconductor fins 30 can be doped to provide suitable electrical isolation among the plurality of semiconductor fins 30.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin.

Each semiconductor fin 30 is laterally bound by a pair of lengthwise sidewalls and a pair of widthwise sidewalls. As used herein, a "lengthwise direction" of an element refers to a direction that is parallel to the axis which passes through the center of mass of the element and about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the plurality of semiconductor fins 30 can have a rectangular horizontal cross-sectional shape. In one embodiment, lengthwise sidewalls of a semiconductor fin 30 can be within a pair of vertical planes laterally spaced from each other by the width w of the semiconductor fin 30.

A shallow trench isolation layer 20 can be formed among the plurality of semiconductor fins 30. The shallow trench isolation layer 20 includes a dielectric material such as silicon oxide. The shallow trench isolation layer 20 can be formed by depositing a dielectric material over the semiconductor fins 30 and the semiconductor material layer 10. The deposition of the dielectric material can be performed, for example, by chemical vapor deposition or spin coating. Excess portions of the deposited dielectric material can be removed from above the top surfaces of the semiconductor fins 30, for example, by planarization (such as chemical mechanical planarization (CMP)). The shallow trench isolation layer 20 laterally surrounds the plurality of semiconductor fins 30. The top surface of the shallow trench isolation layer 20 can be coplanar with the top surfaces of the plurality of semiconductor fins 30.

Referring to FIGS. 2A-2D, a stack of gate level layers can be deposited and lithographically patterned to form gate structures (50, 52, 58). The gate level layers can include, for example, a gate dielectric layer, a conductive material layer, and optionally, a gate cap layer.

The gate dielectric layer can be formed by conversion of surface portions of the semiconductor material of the semiconductor fins 30, deposition of a dielectric material, or a combination thereof. The gate dielectric layer can include a dielectric semiconductor-containing compound (e.g., silicon oxide, silicon nitride, and/or silicon oxynitride) and/or a dielectric metal compound (e.g., dielectric metal oxide, dielectric metal nitride, and/or dielectric metal oxynitride).

The conductive material layer can include at least one conductive material such as a metallic material, a doped semiconductor material, or a combination thereof. The conductive material layer can optionally include a work function metal layer that tunes the threshold voltage of the access transistor to be formed. The gate cap layer includes a dielectric material such as silicon nitride or a dielectric nitride.

The gate level layers can be patterned by a combination of lithography and etch to form the gate structures (50, 52, 58). The gate structures (50, 52, 58) straddle the portions of the semiconductor fins 30 that become body regions of field effect transistors. Each remaining portion of the gate dielectric layer within a gate structure (50, 52, 58) constitutes a gate dielectric 50. Each remaining portion of the conductive material layer within a gate structure (50, 52, 58) constitutes a gate electrode 52. Each remaining portion of the gate cap layer within a gate structure (50, 52, 58) constitutes a gate cap dielectric 58.

Portions of the semiconductor fins 30 that underlie the gate structures (50, 52, 58) correspond to the body regions of field effect transistors. The gate structures (50, 52, 58) can extend along the general direction of the widthwise direction of the plurality of semiconductor fins 30.

In one embodiment, the gate structures (50, 52, 58) are permanent gate structures that are present in field effect transistors and function as a combination of a gate dielectric and a gate electrode. In one embodiment, the gate structures (50, 52, 58) can be disposable gate structures that are subsequently replaced with replacement gate structures as known in the art.

Optionally, each gate structures (50, 52, 58) can further include a dielectric gate spacer (not shown). The dielectric gate spacers can be formed by depositing a conformal dielectric layer and anisotropically etching the conformal dielectric layer. The conformal dielectric layer can include, for example, silicon nitride, silicon oxide, or silicon oxynitride. The etch process that removes horizontal portions of the conformal dielectric layer can be prolonged after horizontal portions of the conformal dielectric layer are removed so that vertical portions of the conformal dielectric layer on sidewalls of the semiconductor fins 30 are removed, while the dielectric gate spacers remain on sidewalls of the gate electrodes 52. Each dielectric gate spacer, if present, laterally surrounds a gate electrode 52.

Referring to FIGS. 3A-3F, a dielectric material liner 56' is formed employing a pair of directional ion beam deposition processes. The pair of directional ion beam deposition processes provide two directional ion beams that sequentially impinge on the surfaces of the semiconductor fins 30, the gate structures (50, 52, 58), and the shallow trench isolation layer 20. Each directional ion beam is contained within a vertical plane defined by the lengthwise direction of the semiconductor fins 30 and a vertical direction. A direction ion beam impinges on the surfaces of the semiconductor fins 30 and the gate structures (50, 52, 58) during each of the pair of directional ion beam deposition processes.

The directional ion beams can be generated by a gas cluster ion beam implantation tool known in the art. The process of depositing or implanting a material employing the directional ion beam is herein referred to as a directional ion beam deposition process. In one embodiment, the directional ion beam deposition process can employ a gas cluster ion beam as known in the art. A gas cluster ion beam includes typically thousands of weakly bound atoms or molecules, which become ionized with a small amount of electrical charge that typically corresponds to the electrical charge of a single electron or several electrons.

Angled gas cluster ion beam can be employed, which includes a dielectric material. In one embodiment, the directional ion beam and the dielectric material liner 56' can include silicon oxide, silicon nitride, silicon oxynitride, a dielectric metal oxide, a dielectric metal nitride, or a combination thereof. In a gas cluster ion beam deposition process, a cluster of ions generated from a dielectric material and having a molecular weight in a range from 100 to 100,000 can be singly ionized, or ionized with a number of electrons that does not typically exceed 10. Such clusters of ions can travel at a low enough speed to be deposited on a surface of the target of the gas cluster ion beam, or to be implanted immediately beneath a surface of the target.

The directional ion beam can include ionized clusters of a dielectric material, which is deposited on surfaces of the semiconductor fins 30 that are not parallel to the lengthwise direction of the semiconductor fins 30 to form the dielectric material liner 56'. In this case, the dielectric material liner 56' includes a deposited dielectric material that is formed by de-ionizing the ionized gas clusters in the gas cluster ion beam. For example, the directional ion beam can include clusters of ions of a dielectric material such as silicon oxide, silicon nitride, silicon oxynitride, a dielectric metal oxide, a dielectric metal nitride, or a combination thereof. Thus, the directional ion beam can include ions of a cluster of silicon oxide, ions of a cluster of silicon nitride, ions of a cluster of a dielectric metal oxide, or ions of a cluster of a dielectric metal nitride. The dielectric material liner 56' includes a deionized dielectric material that is the same in composition as the dielectric material in the directional ion beam except for the deionization of the dielectric material.

In one embodiment, the directional ion beam can be angled relative to the vertical direction perpendicular to the top surfaces of the semiconductor fins 30 as illustrated in FIGS. 3A and 3B. In one embodiment, the directional ion beam deposition process can be performed in two steps. In the first step, the direction of the directional ion beam be selected such that a first unit vector representing the direction of the directional ion beam includes a downward vertical component and a horizontal component within a vertical plane including the lengthwise direction of the semiconductor fins 30. In the second step, the direction of the directional ion beam can be selected that a second unit vector representing the direction of the directional ion beam includes the same downward vertical component as the first unit vector, and a horizontal component that is the opposite of the horizontal component of the first unit vector. Thus, each directional ion beam during the pair of directional ion beam deposition processes is at a non-zero angle with respect to the vertical direction, which is parallel to the surface normal of the top surfaces of the semiconductor fins 30.

Thus, the first unit vector and the second unit vector are within a vertical plane including the lengthwise direction of the semiconductor fins 30. Optionally, a third step in which the direction of the directional ion beam is along a downward vertical direction may be added prior to the first step, between the first step and the second step, or after the second step. Thus, the beam direction is contained within a vertical plane parallel to lengthwise sidewalls of the semiconductor fins 30 throughout each step of the directional ion beam process. All beam directions during the directional ion beam process can be contained within a vertical plane parallel to the lengthwise sidewalls of the semiconductor fins 30.

Methods of generating a gas cluster ion beam are known in the art, and can be found, for example, in U.S. Patent Application Publication No. 2002/0014407 to Allen et al. and U.S. Patent Application Publication No. 2001/0010835 to Akizuki et al.

In one embodiment, the dielectric material liner 56' can be a contiguous dielectric material layer that is formed on, and extends across, the widthwise sidewalls and top surfaces of the semiconductor fins 30 and sidewall surfaces and the top surfaces of the gate stacks (50, 52, 58). The directional ion beam deposits, on the lengthwise sidewalls of the semiconductor fins 30, no material, or lesser material than on the widthwise sidewalls of the semiconductor fins 30.

In one embodiment, the directional ion beam deposits no material on the lengthwise sidewalls of the semiconductor fins 30. In this case, all portions of the lengthwise sidewalls of the semiconductor fins 30 that are laterally spaced from the gate structures (50, 52, 58) by a greater distance than the thickness the dielectric material liner 56' on the sidewalls of the gate structures (50, 52, 58), are physically exposed after the directional ion beam deposition process. In other words, the dielectric material liner 56' is not deposited on physically exposed sidewalls of the semiconductor fins that are parallel to the lengthwise direction and spaced from sidewalls of the gate structures (50, 52, 58) by a distance greater than the thickness of the dielectric material liner 56'.

In another embodiment, the directional ion beam deposits any material on the lengthwise sidewalls of the semiconductor fins 30, for example, due to a finite angular spread in the direction of the ion clusters. Thus, the pair of directional ion beam deposition processes deposits less dielectric material on sidewalls of the semiconductor fins 30 that are parallel to the lengthwise direction than on end walls of the semiconductor fins 30 that are perpendicular to the lengthwise direction. In this case, an isotropic etch such as a wet etch can be performed to remove the deposited material from the lengthwise sidewalls of the semiconductor fins 30. All portions of the lengthwise sidewalls of the semiconductor fins 30 that are laterally spaced from the gate structures (50, 52, 58) by a greater distance than the thickness the dielectric material liner 56' on the sidewalls of the gate structures (50, 52, 58), are physically exposed after the isotropic etch. The dielectric material liner 56' remains on the end walls of the semiconductor fins 30 that are perpendicular to the lengthwise direction after the isotropic etching.

In one embodiment, the dielectric material liner 56' can include silicon nitride or silicon oxide. The thickness of each dielectric material liner 56', as measured at a widthwise sidewall of a semiconductor fin 30, can be in a range from 3 nm to 30 nm, although lesser and greater thicknesses can also be employed.

Optionally, an anisotropic etch can be performed to remove horizontal portions of the dielectric material liner 56' from portions of the top surfaces of the semiconductor fins 30' and from the top surface of the shallow trench isolation layer 20. The anisotropic etch can be performed employing a GCIB beam including an etchant chemical (such as HF clusters or clusters of at least one fluorohydrocarbon molecule species), or can be performed by a reactive ion etch.

Referring to FIGS. 4A-4E, raised active regions 4A are formed on physically exposed semiconductor surfaces of the semiconductor fins 30 by selective deposition of a semiconductor material. The selective deposition of the semiconductor material is performed while the dielectric material liner 56' is present on the widthwise sidewalls of the semiconductor fins 30 and on the sidewalls of each gate stack (50, 52, 58) that extend along the widthwise direction of the semiconductor fins 30. The raised active regions 4A are formed on physically exposed semiconductor surfaces of the semiconductor fins 30 while the dielectric material liner 56' is present on the surfaces of the semiconductor fins 30 and the gate structures (50, 52, 58).

In one embodiment, the selective deposition of the semiconductor material can be performed by a selective epitaxy process. During the selective epitaxy process, the deposited semiconductor material grows from physically exposed semiconductor surfaces, i.e., the physically exposed portions of the lengthwise sidewalls and top surfaces of the semiconductor fins 30, while the semiconductor material is not deposited on, and thus, does not grow from, dielectric surfaces such as the surfaces of the dielectric material liner 56' and the shallow trench isolation layer 20.

A raised active region 4A can be formed directly on each physically exposed surface of the semiconductor fins 30. As used herein, a "raised active region" refers to an active region (i.e., a source region or a drain region) that is located on, and outside, a semiconductor fin or a preexisting semiconductor material portion. In one embodiment, each portion of the raised active regions 4A can be epitaxially aligned to an underlying semiconductor fin 30. The raised active regions 4A can include the same semiconductor material as, or a semiconductor material different from, the semiconductor material of the semiconductor fins 30.

The growth of the raised active regions 4A can proceed with, or without, crystallographically faceted surfaces depending on the deposited semiconductor material and the deposition conditions. In one embodiment, the various semiconductor material portions of the raised active regions 4A can be formed with crystallographic facets. The crystallographic facets of the raised active regions 4A can be at a non-zero, non-orthogonal, angle with respect to adjoining surfaces of the raised active regions 4A.

While the shapes of the raised active regions 4A are illustrated as trapezoids in the top-down view of FIG. 4A, the shapes of the raised active regions 4A in a top-down view may be rectangular or triangular depending on the nature of crystallographic surfaces of the semiconductor fins 30 and the processing parameters of the selective epitaxy process. Such variations are expressly contemplated herein.

Referring to FIGS. 5A-5E, the selective epitaxy process can proceed until multiple raised active regions 4A from neighboring semiconductor fins 30 merge. Within each merged raised active region 4A, grain boundaries GB can be formed at the interface at which neighboring raised active regions 4A contact each other. The selective epitaxy process can be terminated when the sizes of the raised active regions 4A reach a predetermined target, for example, by controlling the deposition conditions and the deposition time.

In one embodiment, the raised active regions 4A can be formed with in-situ doping during the selective epitaxy process. Thus, each portion of the raised active regions 4A can be formed as doped semiconductor material portions. Alternatively, the raised active regions 4A can be formed by ex-situ doping. In this case, the raised active regions 4A can be formed as intrinsic semiconductor material portions and electrical dopants can be subsequently introduced into the raised active regions 4A to convert the raised active regions 4A into doped semiconductor material portions.

If ex-situ doping is employed, ion implantation can provide electrical doping to portions of the semiconductor fins 30 that do not underlie the gate structures (50, 52, 58). The implanted portions of the semiconductor fins 30 are converted into fin active regions 3A. As used herein, an "active region" can be a source region or a drain region of a field effect transistor. As used herein, a "fin active region" refers to an active region located within a semiconductor fin. As used herein, a "fin source region" refers to a source region located within a semiconductor fin. As used herein, a "fin drain region" refers to a drain region located within a semiconductor fin.

If the semiconductor fins 30 include electrical dopants of a first conductivity type, ions of a second conductivity type that is the opposite of the first conductivity type can be implanted to for the fin active regions 3A. For example, the first conductivity type can be p-type and the second conductivity type can be n-type, or vice versa.

If in-situ doping is employed, an anneal process can be performed to outdiffuse the electrical dopants from the raised active regions 4A into underlying portions of the semiconductor fins 30 to form fin active regions 3A.

The fin active regions 3A can be formed by ion implantation concurrently with the ex-situ doping of the raised active regions 4A, by in-situ doping of raised active regions 4A during the selective epitaxy process and outdiffusion of dopants from the raised active regions 4A by an anneal, or a combination of ex-situ doping of the raised active regions 4A, in-situ doping of the raised active regions 4A during the selective epitaxy process, and outdiffusion of dopants from the raised active regions 4A by an anneal.

After formation of the fin active regions 3A, each portion of the semiconductor fins 30 having a doping of the first conductivity type constitutes a body region 3B. A p-n junction can be formed at the interfaces between each adjoining pair of a body region 3B and a fin active region 3A.

The exemplary semiconductor structure includes at least a semiconductor fin 30 that is located on a semiconductor material layer 10 that constitutes a substrate, and extending along a lengthwise direction. The exemplary semiconductor structure further includes a gate structure (50, 52, 58) straddling the semiconductor fin 30 and containing a stack of a gate dielectric 50 and a gate electrode 52. Further, the exemplary semiconductor structure includes a dielectric material liner 56' located on the semiconductor fin 30. Portions of the dielectric material liner 56' in contact with a top surface of the semiconductor fin (3A, 3B) and an end wall of the semiconductor fin (3A, 3B) have the same width w as the semiconductor fin (3A, 3B).

The exemplary semiconductor structure can further include a pair of raised active regions 4A including a doped semiconductor material, contacting a fin active region 3A, and laterally spaced from each other by the same width w. The pair of raised active regions 4A includes a doped semiconductor material, and is in contact with the lengthwise sidewalls of the semiconductor fin (3A, 3B). The pair of raised active regions 4A includes can contact the sidewalls of the portions of the dielectric material liner 56' that overlie the semiconductor fin (3A, 4A). In one embodiment, two interfaces between the portions of the dielectric material liner 56' overlying the semiconductor fin (3A, 3B) and the pair of raised active regions 4A can be laterally spaced from each other by the same width w. In one embodiment, the sidewalls of the semiconductor fins (3A, 3B) can be vertical, and each interface between the semiconductor fin (3A, 3B) and a raised active region 4A can be vertical, and can laterally extend along the lengthwise direction.

In one embodiment, the dielectric material liner 56' can contact all surfaces of sidewalls of the gate structure (50, 52, 58) that are not parallel to the lengthwise direction. In one embodiment, the dielectric material liner 56' can contact the entire top surface of the gate structure (50, 52, 58).

The exemplary semiconductor structure can further include a shallow trench isolation layer 20 contacting a top surface of the semiconductor material layer 10 that constitutes a substrate, and laterally surrounding a lower portion of the semiconductor fin (3A, 3B). A horizontal portion of the dielectric material liner 56' contacts a top surface of the shallow trench isolation layer 20. In one embodiment, the entire top surface of the shallow trench isolation layer 20 can contact a bottom surface of the dielectric material liner 56'.

Referring to FIGS. 6A-6E, a contact level dielectric layer 80 can be formed over the semiconductor fins (3A, 3B), the raised active regions 4A, the gate structures (50, 52, 58), and the dielectric material liner 56'. The contact level dielectric layer 80 includes a dielectric material such as silicon oxide, silicon nitride, silicon oxynitride, porous or non-porous organosilicate glass (OSG), or a combination thereof. The contact level dielectric layer 80 can be deposited, for example, by chemical vapor deposition. Optionally, the top surface of the contact level dielectric layer 80 can be planarized, for example, by chemical mechanical planarization.

The contact level dielectric layer 80 is in physical contact with the raised active regions 4A. Further, the contact level dielectric layer 80 can be in physical contact with top surfaces and sidewall surfaces of the dielectric material liner 56' and sidewall surfaces of the gate structure (50, 52, 58) that are parallel to the lengthwise direction. Specifically, the dielectric material of the contact level dielectric layer 80 can contact sidewalls of the gate stacks (50, 52, 58) that extend along the lengthwise direction of the semiconductor fins 30. In one embodiment, the dielectric material of the contact level dielectric layer 80 can contact sidewall surfaces of a gate dielectric 50 that extend along the lengthwise direction of the semiconductor fins 30, sidewall surfaces of the gate electrodes 52 that extend along the lengthwise direction of the semiconductor fins 30, and sidewall surfaces of a gate cap dielectric 58 that extend along the lengthwise direction of the semiconductor fins 30.

Various contact via structures (8A, 8G) are formed through the contact level dielectric layer 80 to provide electrical contact to various nodes of the fin field effect transistors. For example, active region contact via structures 8A provide electrical contact to the various raised active regions 4A and the fin active regions 3A, and gate contact via structures 8G provide electrical contact to the gate electrodes 52.

Referring to FIG. 7, a first variation of the exemplary structure can be derived from the exemplary structure by employing a semiconductor-on-insulator substrate including a handle substrate 10, a buried insulator layer 120, and a top semiconductor layer. The top semiconductor layer can be patterned to form the semiconductor fins 30 illustrated in FIGS. 1A and 1B. Formation of the shallow trench isolation layer 20 can be omitted, and the dielectric material liner 56' can be formed directly on the top surface of the buried insulator layer 120 in lieu of a top surface of a shallow trench isolation layer 20. Thus, a horizontal portion of the dielectric material liner 56' contacts a top surface of buried insulator layer 120, which is an insulator layer.

Figure 8A:
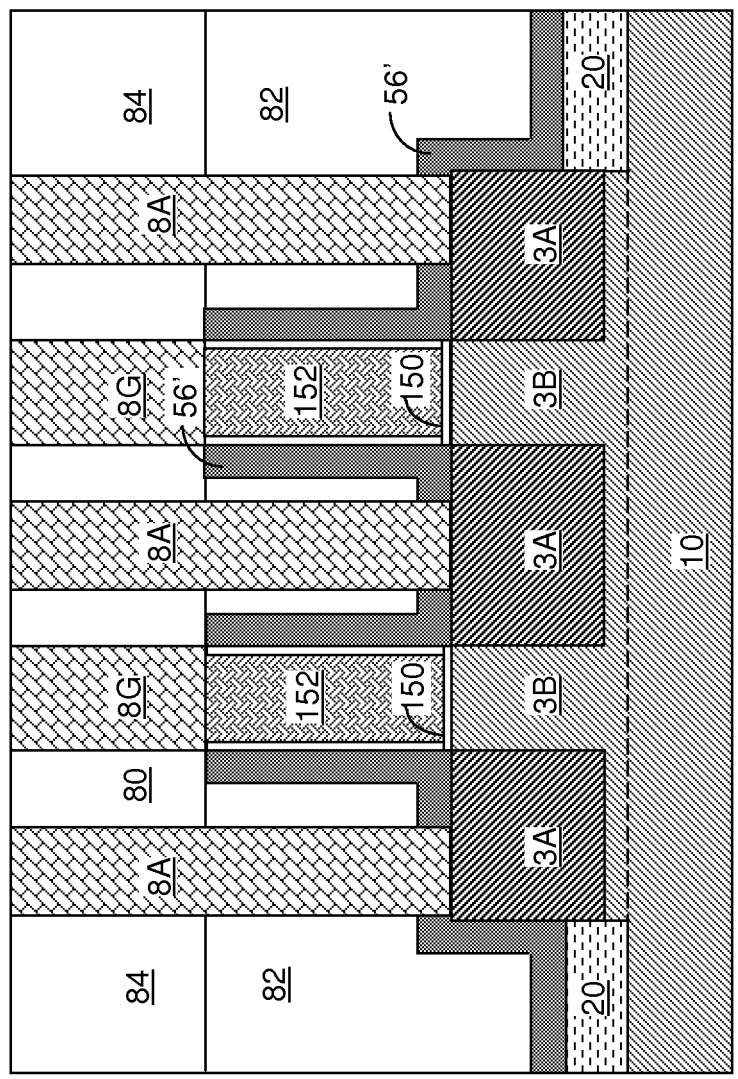
FIG. 8A is a vertical cross-sectional view of a second variation of the exemplary structure along a vertical plane corresponding to B-B' in FIG. 6A.
Figure 8B:
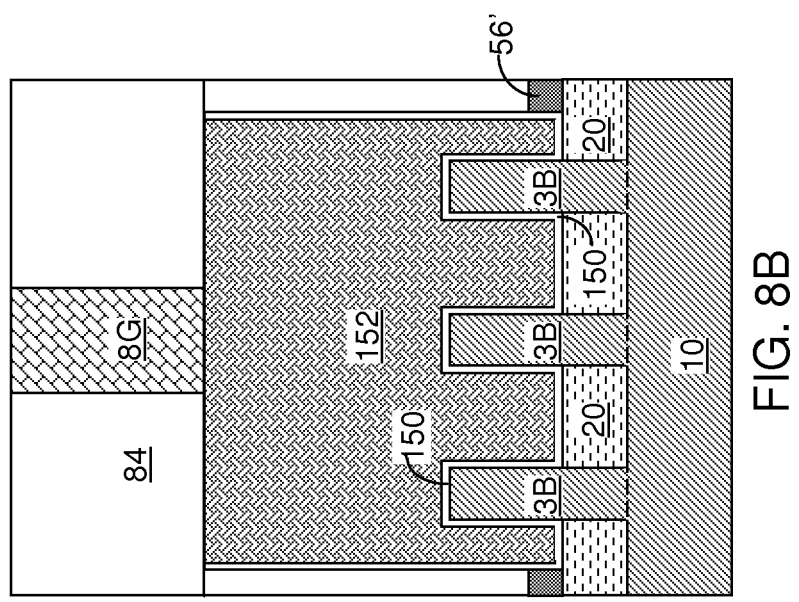
FIG. 8B is a vertical cross-sectional view of the second variation of the exemplary structure along a vertical plane corresponding to C-C' in FIG. 6C.
Figure 9B:
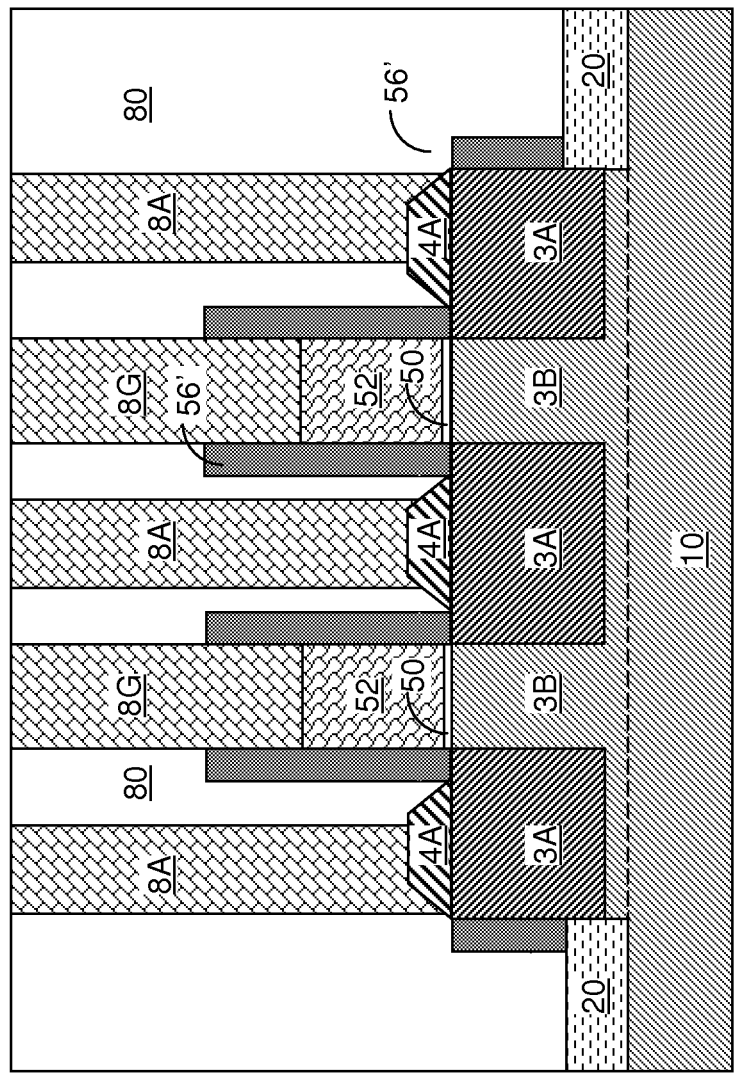
FIG. 9B is a vertical cross-sectional view of the third variation of the exemplary structure along the vertical plane B-B' in FIG. 9A.

Referring to FIGS. 8A and 8B, a second variation of the exemplary structure can be derived from the exemplary structure of the first variation of the exemplary structure by employing a replacement gate integration scheme. In this case, a disposable gate structure can be formed in lieu of the gate structure (50, 52, 58) illustrated in FIGS. 2A-2D. The disposable gate structure includes at least one disposable material portion, i.e., at least one material portion that can be subsequently removed selective to the dielectric material liner 56' and the semiconductor material of the semiconductor fins (3A, 3B). For example, the disposable gate structure can include a stack of a silicon oxide portion and a semiconductor material portion that includes a semiconductor material such as silicon, germanium, and/or a silicon-germanium alloy.

Further, a planarization dielectric layer 82 can be formed in lieu of a contact level dielectric layer 80. The top portion of the planarization dielectric layer 82 and the top portion of the dielectric material liner 56' overlying the disposable gate structure can be removed, for example, by chemical mechanical planarization. The disposable gate structure can be replaced with a replacement gate structure, which can include a gate dielectric 150 and a gate electrode 152. The gate dielectric 150 can include a high dielectric constant (high-k) dielectric material known in the art. The gate electrode 150 can include a doped semiconductor material and/or a metallic material. The top surfaces of the replacement gate structure (150, 152) can be coplanar with the top surface of the planarization dielectric layer 82 and the topmost surfaces of the remaining portions of the dielectric material liner 56'.

A contact level dielectric layer 84 can be deposited over the planarization dielectric layer 82, and various contact via structures (8A, 8G) can be formed through the contact level dielectric layer 84 and the planarization dielectric layer 82. The contact level dielectric layer 84 can be in physical contact with topmost surfaces of the dielectric material liner 56'. The topmost surface of the dielectric material liner 56' can be coplanar with the top surfaces of the replacement gate structure (150, 152). The planarization dielectric layer 82 can be in physical contact with the sidewall surfaces of the dielectric material liner 56' and sidewall surfaces of the replacement gate structure (150, 152) that are parallel to the lengthwise direction of the semiconductor fins (3A, 3B). Specifically, the sidewalls of the gate dielectric 150 that are parallel to the lengthwise direction of the semiconductor fins (3A, 3B) can be in physical contact with the planarization dielectric layer 82.

The methods of the present disclosure eliminate the need to anisotropically etch a dielectric material layer to form a gate spacer. The dielectric material liner 56' functions as a gate spacer without employing an anisotropic etch process, which can damage the semiconductor fins and/or can recess a shallow trench isolation layer or a buried insulator layer. Thus, the methods of the present disclosure can be employed to reduce the number of processing steps, processing costs, processing time, and the likelihood of structural damage to semiconductor fins and/or other dielectric material layers.

Referring to FIGS. 9A-9E, a third variation of the exemplary semiconductor structure can be derived from the exemplary semiconductor structure by performing an anisotropic etch after the processing steps of FIGS. 4A-4E. A GPIB etch employing a vertically incident beam or an anisotropic etch can be employed to remove horizontal portions of the dielectric material liner 56'. The raised active regions 4A can be subsequently grown from physically exposed top surfaces and sidewalls of each semiconductor fin 30.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor fin that is located on a substrate and extending along a lengthwise direction;
   a gate structure straddling said semiconductor fin and including a stack of a gate dielectric and a gate electrode;
   a dielectric material liner located on said semiconductor fin, wherein portions of said dielectric material liner in contact with a top surface of said semiconductor fin and an end wall of said semiconductor fin have a same width as said semiconductor fin; and
   a pair of raised active regions comprising a doped semiconductor material and laterally spaced from each other by said same width, wherein said pair of raised active regions contacts sidewalls of said portions of said dielectric material liner.

2. The semiconductor structure of claim 1, wherein interfaces between said portions of said dielectric material liner and said pair of raised active regions are laterally spaced from each other by said same width.

3. The semiconductor structure of claim 1, further comprising a contact level dielectric layer in physical contact with said raised active regions.

4. The semiconductor structure of claim 3, wherein said dielectric material liner contacts a top surface of said gate structure.

5. The semiconductor structure of claim 1, wherein said dielectric material liner contacts all surfaces of sidewalls of said gate structure that are not parallel to said lengthwise direction.

6. The semiconductor structure of claim 1, further comprising a shallow trench isolation layer contacting a top surface of said substrate and laterally surrounding a lower portion of said semiconductor fin, wherein a horizontal portion of said dielectric material liner contacts a top surface of said shallow trench isolation layer.

7. The semiconductor structure of claim 6, wherein said dielectric material liner is a contiguous dielectric material layer directly on widthwise sidewalls and a top surface of said semiconductor fin, sidewall surfaces and a top surface of said gate structure, and a top surface of said shallow trench isolation layer.

8. The semiconductor structure of claim 1, wherein said substrate includes a vertical stack of a handle substrate and an insulator layer, wherein a horizontal portion of said dielectric material liner contacts a top surface of said insulator layer.

9. The semiconductor structure of claim 1, further comprising a contact level dielectric layer in physical contact with top surfaces and sidewall surfaces of said dielectric material liner and sidewall surfaces of said gate structure that are parallel to said lengthwise direction.

10. The semiconductor structure of claim 9, wherein a topmost surface of said dielectric material liner is coplanar with a top surface of said gate structure.

11. The semiconductor structure of claim 1, wherein said substrate is a semiconductor-on-insulator substrate.

12. The semiconductor structure of claim 1, wherein said substrate comprises a single crystalline semiconductor material.

13. The semiconductor structure of claim 1, wherein said stack further comprises a gate cap layer.

14. A semiconductor structure comprising:
   a semiconductor fin that is located on a substrate and extending along a lengthwise direction;
   a gate structure straddling said semiconductor fin and including a stack of a gate dielectric and a gate electrode;
   a dielectric material liner located on said semiconductor fin, wherein portions of said dielectric material liner in contact with a top surface of said semiconductor fin and an end wall of said semiconductor fin have a same width as said semiconductor fin; and
   a contact level dielectric layer in physical contact with top surfaces and sidewall surfaces of said dielectric material liner and sidewall surfaces of said gate structure that are parallel to said lengthwise direction, wherein a topmost surface of said dielectric material liner is coplanar with a top surface of said gate structure.

15. The semiconductor structure of claim 14, further comprising a raised active region comprising a doped semiconductor material and in contact with lengthwise sidewalls of said semiconductor fin.

16. The semiconductor structure of claim 15, wherein each interface between said semiconductor fin and said raised active region is vertical and laterally extends along said lengthwise direction.

17. The semiconductor structure of claim 14, further comprising a pair of raised active regions comprising a doped semiconductor material and laterally spaced from each other by said same width.

18. The semiconductor structure of claim 17, wherein said pair of raised active regions contacts sidewalls of said portions of said dielectric material liner.

19. The semiconductor structure of claim 18, wherein interfaces between said portions of said dielectric material liner and said pair of raised active regions are laterally spaced from each other by said same width.

* * * * *